US011923211B2

(12) United States Patent
Endo et al.

(10) Patent No.: US 11,923,211 B2
(45) Date of Patent: Mar. 5, 2024

(54) CORRECTION DATA CREATING METHOD, SUBSTRATE PROCESSING METHOD, AND SUBSTRATE PROCESSING SYSTEM

(71) Applicant: TOKYO ELECTRON LIMITED, Tokyo (JP)

(72) Inventors: Hiroki Endo, Miyagi (JP); Tomohisa Kitayama, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 503 days.

(21) Appl. No.: 16/911,130

(22) Filed: Jun. 24, 2020

(65) Prior Publication Data

US 2020/0411339 A1 Dec. 31, 2020

(30) Foreign Application Priority Data

Jun. 28, 2019 (JP) ................................. 2019-121738

(51) Int. Cl.
*H01L 21/67* (2006.01)
*F27D 5/00* (2006.01)
(Continued)

(52) U.S. Cl.
CPC ...... *H01L 21/67103* (2013.01); *F27D 5/0037* (2013.01); *H01J 37/32724* (2013.01);
(Continued)

(58) Field of Classification Search
CPC ............ F27D 5/0037; H01J 2237/2001; H01J 37/32724; H05B 1/0233; H05B 2203/005;
(Continued)

(56) References Cited

U.S. PATENT DOCUMENTS

2007/0209933 A1\* 9/2007 Yoshioka .......... H01J 37/32431
204/298.31
2011/0210116 A1\* 9/2011 Shigetomi ......... H01L 21/67109
219/494
(Continued)

FOREIGN PATENT DOCUMENTS

JP 2017-228230 A 12/2017

*Primary Examiner* — Sang Y Paik
(74) *Attorney, Agent, or Firm* — XSENSUS LLP

(57) ABSTRACT

A correction data creating method is provided. In the method, a source voltage is sequentially selected among a plurality of source voltages determined in advance and the selected source voltage is supplied to a heater for heating a substrate support. At the source voltage supplied to the heater, a power supplied to the heater is adjusted such that a resistance of the heater becomes a resistance value corresponding to a predetermined first temperature based on temperature conversion data indicating a relationship between the resistance of the heater and a temperature of the heater. A temperature of the substrate support is measured at a position where the heater is disposed as a second temperature. A correction value corresponding to the difference between the predetermined first temperature and the second temperature is calculated, and correction data indicating a corresponding relationship between each of the source voltages and the correction value is created.

11 Claims, 14 Drawing Sheets

(51) Int. Cl.
*H01J 37/32* (2006.01)
*H01L 21/683* (2006.01)
*H05B 1/02* (2006.01)
*H05B 3/22* (2006.01)

(52) U.S. Cl.
CPC .... *H01L 21/67248* (2013.01); *H01L 21/6833* (2013.01); *H05B 1/0233* (2013.01); *H05B 3/22* (2013.01); *H01J 2237/2001* (2013.01); *H05B 2203/005* (2013.01); *H05B 2203/035* (2013.01); *H05B 2213/07* (2013.01)

(58) Field of Classification Search
CPC ................... H05B 2203/035; H05B 2213/07; H05B 3/22; H05B 3/283
USPC ........................... 219/482–486, 443.1–444.1
See application file for complete search history.

(56) References Cited

U.S. PATENT DOCUMENTS

2012/0074119 A1* 3/2012 Watanabe .......... G03G 15/2039
219/216
2017/0372928 A1* 12/2017 Yamada .............. H01L 21/6831

* cited by examiner

Figures 4, 5:
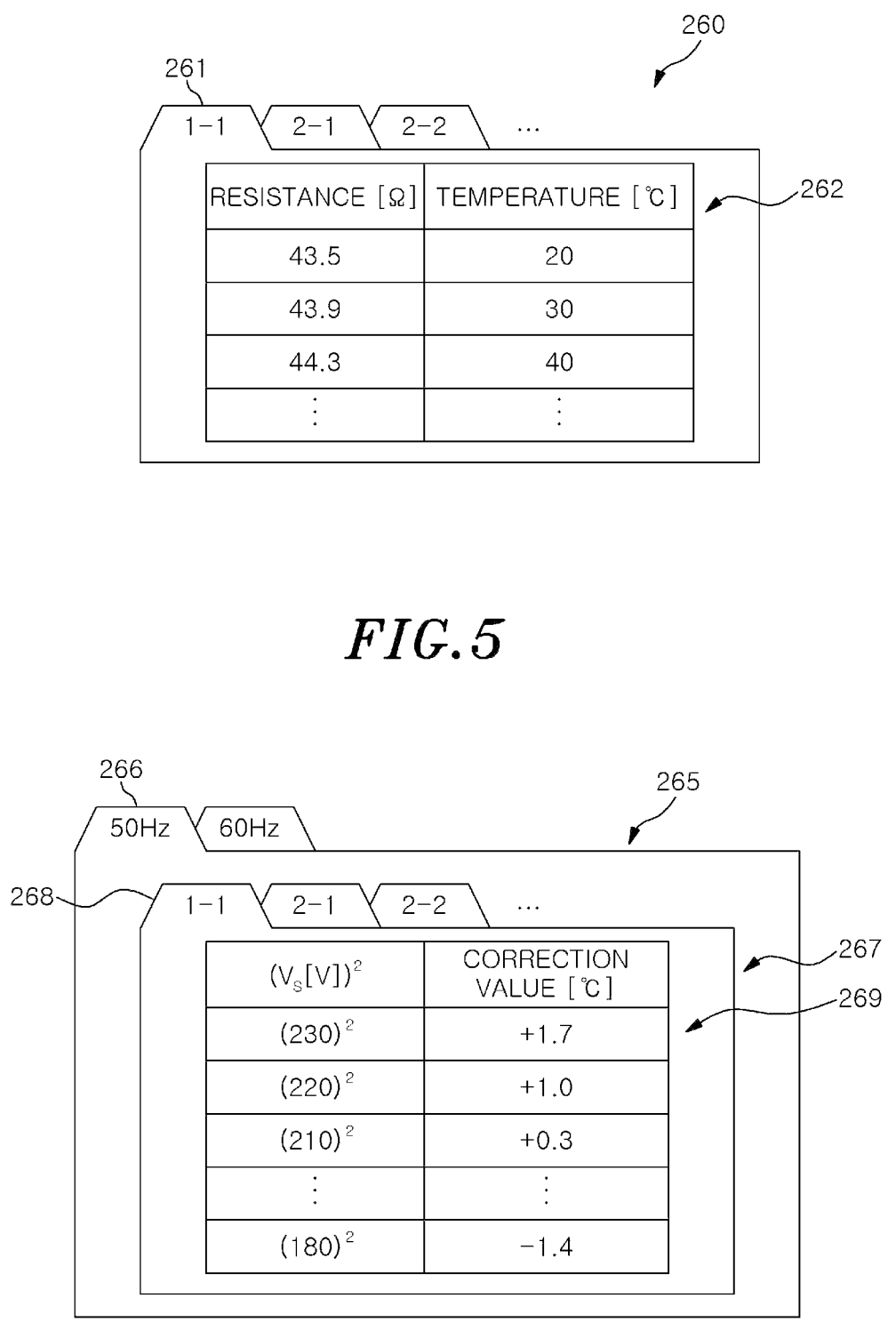

| 1-1 | 2-1 | 2-2 | ... |

262

| RESISTANCE [Ω] | TEMPERATURE [°C] |
|---|---|
| 43.5 | 20 |
| 43.9 | 30 |
| 44.3 | 40 |
| ⋮ | ⋮ |

| 50Hz | 60Hz |

268 · 267 · 269

| $(V_S[V])^2$ | CORRECTION VALUE [°C] |
|---|---|
| $(230)^2$ | +1.7 |
| $(220)^2$ | +1.0 |
| $(210)^2$ | +0.3 |
| ⋮ | ⋮ |
| $(180)^2$ | −1.4 |

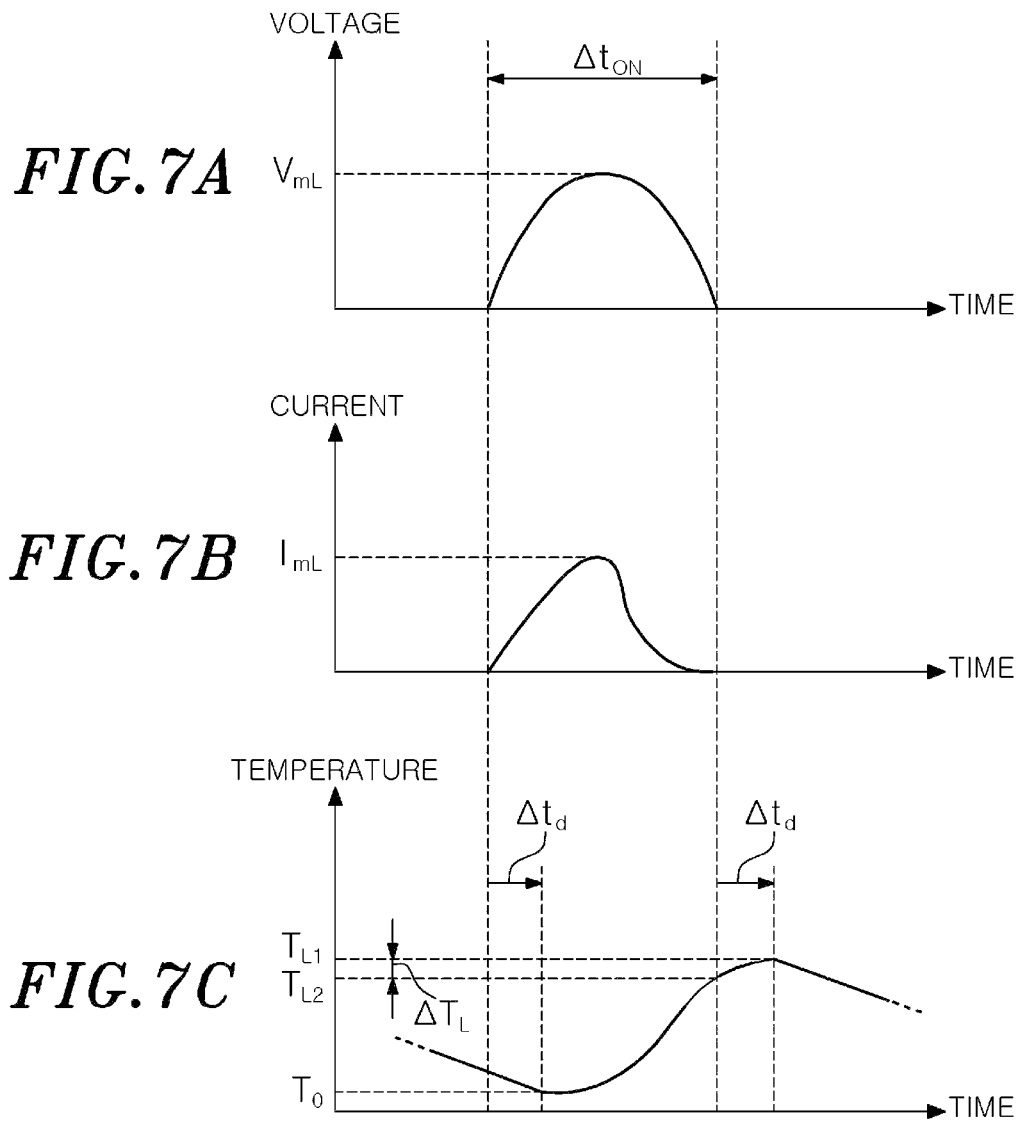

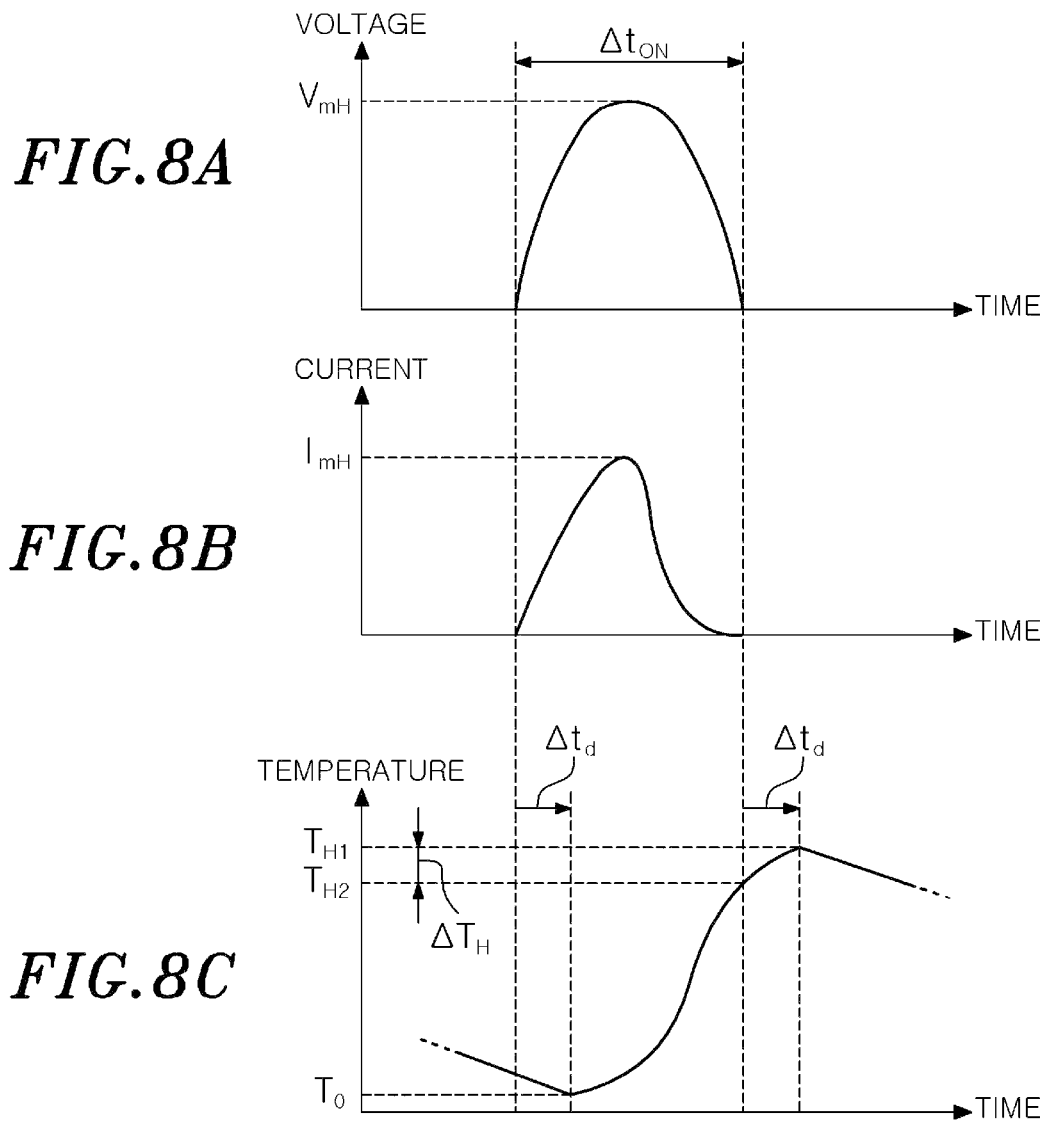

CORRECTION DATA CREATING METHOD, SUBSTRATE PROCESSING METHOD, AND SUBSTRATE PROCESSING SYSTEM

CROSS-REFERENCE TO RELATED APPLICATIONS

This application claims priority to Japanese Patent Application No. 2019-121738, filed on Jun. 28, 2019, the entire contents of which are incorporated herein by reference.

TECHNICAL FIELD

The present disclosure relates to a correction data creating method, a substrate processing method, and a substrate processing system.

BACKGROUND

For a recent semiconductor manufacturing process, a very high degree of accuracy for the control is required due to miniaturization. Particularly, it is important to control the temperature of a semiconductor wafer with high accuracy in the manufacturing process. In order to control the temperature of the semiconductor wafer with high accuracy, it is considered to divide a substrate support into a plurality of regions and to independently control temperatures of the regions. However, if the number of regions of the substrate support where temperatures can be independently controlled increases, the size of each region decreases, which makes it difficult to provide heaters and temperature sensors to all of the regions.

As a technique for avoiding such a problem, there is known a technique for measuring in advance a relationship between temperatures and resistances of the heaters respectively disposed in the regions of the substrate support where temperatures can be controlled independently and estimating the temperatures of the respective regions from the resistances of the heaters in the respective regions. The resistances of the heaters are respectively calculated from measured voltages and currents supplied to the heaters. Accordingly, it is not necessary to provide the temperature sensors in addition to the heaters in the respective regions of the substrate support, and the number of regions of the substrate support where the temperatures can be independently controlled can be increased (see, e.g., Japanese Patent Application Publication No. 2017-228230).

The present disclosure provides a correction data creating method, a substrate processing method, and a substrate processing system capable of controlling a temperature of a substrate with a very high degree of accuracy.

SUMMARY

In accordance with an aspect of the present disclosure, there is provided a correction data creating method including a supply step, an adjustment step, a temperature measuring step, a correction value calculation step, and a creation step. In the supply step, a source voltage is sequentially selected among a plurality of source voltages determined in advance, and the selected source voltage is supplied to a heater for heating a substrate support on which a substrate is supported. In the adjustment step, at the source voltage supplied to the heater, a power supplied to the heater is adjusted such that a resistance of the heater becomes a resistance value corresponding to a predetermined first temperature based on temperature conversion data indicating a relationship between the resistance of the heater and a temperature of the heater. In the temperature measuring step, a temperature of the substrate support at a position where the heater is disposed is measured as a second temperature. In the correction value calculation step, a correction value corresponding to the difference between the predetermined first temperature and the second temperature is calculated. In the creation step, correction data indicating a corresponding relationship between each of the source voltages and the correction value is created.

BRIEF DESCRIPTION OF THE DRAWINGS

The objects and features of the present disclosure will become apparent from the following description of embodiments, given in conjunction with the accompanying drawings, in which:

FIG. 4 shows an example of a conversion table;

FIG. 5 shows an example of a correction table;

FIGS. 7A to 7C show an example of a heater temperature increase due to a power supplied to each heater;

FIGS. 8A to 8C show an example of a heater temperature increase due to a power supplied to each heater;

DETAILED DESCRIPTION

Hereinafter, embodiments of a correction data creating method, a substrate processing method, and a substrate processing system of the present disclosure will be described in detail with reference to the accompanying drawings. The following embodiments are not intended to limit the correction data creating method, the substrate processing method, and the substrate processing system of the present disclosure.

In a cleanroom where a substrate processing apparatus is provided, various devices are disposed in addition to the substrate processing apparatus. A source voltage supplied to the devices in the cleanroom may vary depending on the operating status of the devices. If the source voltage varies, an error included in a measured resistance of a heater may increase. When the error included in the measured resistance of the heater increases, an error included in a heater temperature estimated based on the resistance of the heater also increases. Therefore, it is difficult to control the temperature of the heater to a predetermined temperature, and also difficult to control a temperature of a substrate with high accuracy.

Therefore, the present disclosure provides a technique capable of controlling a temperature of the substrate with a very high degree of accuracy.

<Configuration of the Substrate Processing System>

Figure 1:
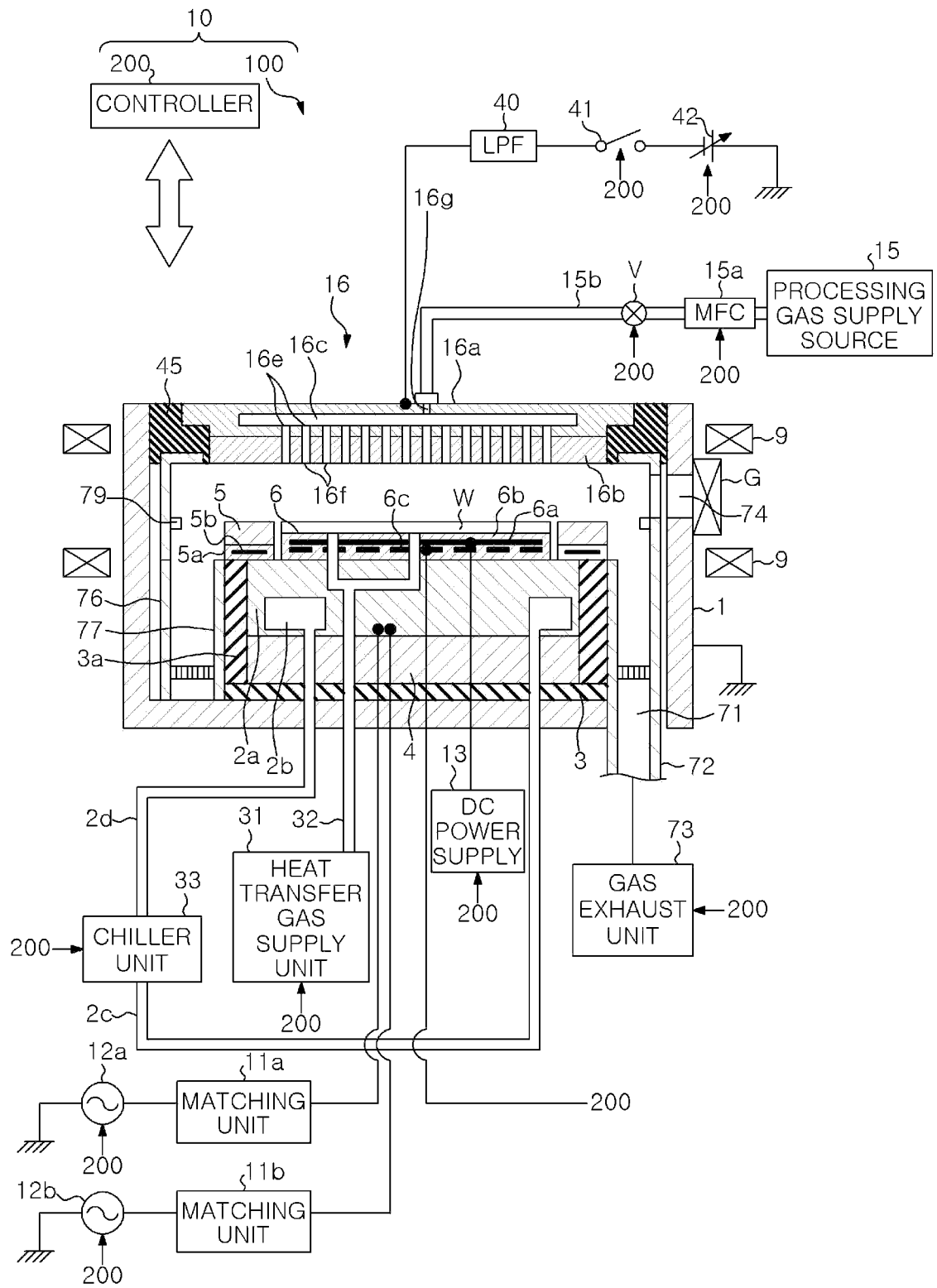
FIG. 1 shows an example of a substrate processing system according to an embodiment of the present disclosure.

FIG. 1 shows an example of a substrate processing system 10. As shown in FIG. 1, for example, the substrate processing system 10 includes a substrate processing apparatus 100 and a controller 200. The substrate processing apparatus 100 performs processing such as plasma etching, plasma chemical vapor deposition (CVD), heat treatment or the like on a semiconductor wafer W that is an example of a substrate. The controller 200 controls respective components of the substrate processing apparatus 100 and executes a predetermined process on the semiconductor wafer W loaded into the substrate processing apparatus 100.

The substrate processing apparatus 100 includes an airtight chamber 1 that is electrically grounded. The chamber 1 is made of, e.g., aluminum having an anodically oxidized surface and has a substantially cylindrical shape.

A base 2a made of a conductive metal such as aluminum or the like is disposed in the chamber 1. The base 2a serves as a lower electrode. The base 2a is supported by a conductive support member 4 disposed on an insulating plate 3. A support 5a is disposed on an upper outer peripheral portion of the base 2a, and an edge ring 5 made of, e.g., single crystalline silicon is disposed on the support 5a. The edge ring 5 may be referred to as "focus ring." One or more heaters 5b are disposed in the support 5a. The heaters 5b generate heat by a power supplied by the controller 200 and heat the edge ring 5 on the support 5a. A substantially cylindrical inner wall member 3a made of, e.g., quartz, is disposed to surround the base 2a and the supporting table 4.

An electrostatic chuck 6 for attracting and holding the semiconductor wafer W and controlling the temperature of the semiconductor wafer W is disposed on an upper surface of the base 2a. The electrostatic chuck 6 has an insulator 6b, an electrode 6a disposed in the insulator 6b, and the heaters 6c. The electrode 6a is connected to a DC power supply 13. The heaters 6c are connected to the controller 200. The electrode 6a generates a Coulomb force on the surface of the electrostatic chuck 6 by a DC voltage applied from the DC power supply 13 and attracts and holds the semiconductor wafer W on an upper surface of the electrostatic chuck 6 by the Coulomb force. The on/off operation of the DC power supply 13 is controlled by the controller 200.

Further, the heaters 6c generate heat by the power supplied by the controller 200 and heat the semiconductor wafer W held on the electrostatic chuck 6. The upper surface of the electrostatic chuck 6 is divided into a plurality of regions. Hereinafter, the regions are referred to as "divided regions." One heater 6c is disposed in each divided region. The electrostatic chuck 6 is an example of a substrate support.

A flow path 2b through which a coolant flows is formed in the base 2a. A chiller unit 33 is connected to the flow path 2b through lines 2c and 2d. By circulating the coolant having a temperature controlled by the chiller unit 33 in the flow path 2b, the base 2a is cooled by heat exchange with the coolant. A temperature and a flow rate of the coolant supplied by the chiller unit 33 are controlled by the controller 200.

Further, a line 32 is formed through the base 2a. The line 32 is connected to a heat transfer gas supply unit 31. A heat transfer gas (backside gas) such as helium gas or the like, which is supplied from the heat transfer gas supply unit 31 to the line 32, is supplied to a gap between the semiconductor wafer W and the electrostatic chuck 6 through the line 32. A pressure of the heat transfer gas supplied to the gap between the semiconductor wafer W and the electrostatic chuck 6 is controlled by the controller 200.

The temperature of the coolant flowing through the flow path 2b, the power supplied to each of the heaters 6c in the electrostatic chuck 6, and the pressure of the heat transfer gas supplied to the backside of the semiconductor wafer W are controlled by the controller 200. Accordingly, the temperature of the semiconductor wafer W attracted to and held on the upper surface of the electrostatic chuck 6 is controlled to a temperature within a predetermined range.

A shower head 16 serving as an upper electrode is disposed above the base 2a to be substantially parallel with the base 2a, i.e., to face the semiconductor wafer W disposed on the base 2a. The shower head 16 and the base 2a function as a pair of electrodes (upper electrode and lower electrode). A radio frequency power supply 12a is connected to the base 2a through a matching unit 11a. A radio frequency power supply 12b is connected to the base 2a through a matching unit 11b.

The radio frequency power supply 12a is configured to supply a radio frequency power having a frequency (e.g., 100 MHz) used for plasma generation to the base 2a. The radio frequency power supply 12b is configured to supply a radio frequency power having a frequency used for attracting ions (bias) to the base 2a. The radio frequency power supplied by the radio frequency power supply 12b has a frequency (e.g., 13 MHz) lower than that of the radio frequency power supplied by the radio frequency power supply 12a. The controller 200 controls the on/off operations of the radio frequency power supplies 12a and 12b, the radio frequency powers supplied by the radio frequency power supplies 12a and 12b, and the like.

The shower head 16 is disposed at an upper portion of the chamber 1. The shower head 16 includes a main body 16a and a ceiling plate 16b that is an electrode plate. The shower head 16 is supported at the upper portion of the chamber 1 through an insulating member 45. The main body 16a is made of, e.g., aluminum having an anodically oxidized surface. The ceiling plate 16b is detachably attached to a bottom surface of the main body 16a. The ceiling plate 16b is made of a silicon-containing material such as quartz or the like.

A diffusion space 16c is formed inside the main body 16a. A plurality of gas injection holes 16e is formed in a bottom portion of the main body 16a to be positioned under the diffusion space 16c. A plurality of gas holes 16f is formed through the ceiling plate 16b in a thickness direction thereof. The gas holes 16f communicate with the gas injection holes 16e, respectively. With this configuration, a processing gas supplied to the diffusion space 16c is diffused and supplied in a shower-like manner into the chamber 1 through the gas injection holes 16e and the gas holes 16f. Further, the main body 16a or the like is provided with a heater (not shown) or a temperature controller (not shown) such as a line for circulating the coolant, so that a temperature of the shower head 16 can be controlled within a desired range during the process of the semiconductor wafer W.

A gas inlet port 16g for introducing a processing gas into the diffusion space 16c is formed at the main body 16a. One end of a line 15b is connected to the gas inlet port 16g and the other end of the line 15b is connected to a processing gas supply source 15 for supplying the processing gas used for processing the semiconductor wafer W through a valve V and a mass flow controller (MFC) 15a. The processing gas supplied from the processing gas supply source 15 is supplied to the diffusion space 16c through the MFC 15a, the valve V, and the line 15b, and then is diffused and supplied in a shower-like manner into the chamber 1 through the gas injection holes 16e and the gas holes 16f. The valve V and the MFC 15a are controlled by the controller 200.

A variable DC power supply 42 is electrically connected to the shower head 16 through a low pass filter (LPF) 40 and a switch 41. The DC voltage supply of the variable DC power supply 42 can be on/off controlled by the switch 41. A current and a voltage of the variable DC power supply 42 and an on/off operation of the switch 41 are controlled by the controller 200. When plasma is generated in the chamber 1 by applying the radio frequency power from the radio frequency power supplies 12a and 12b to the base 2a, the switch 41 is turned on by the controller 200 and a DC voltage is applied to the shower head 16, if necessary.

A gas exhaust port 71 is formed at a bottom portion of the chamber 1. A gas exhaust unit 73 is connected to the gas exhaust port 71 through a gas exhaust line 72. The gas exhaust unit 73 has a vacuum pump. By operating the vacuum pump, a pressure in the chamber 1 can be decreased to a predetermined vacuum level. The exhaust flow rate of the gas exhaust unit 73 or the like is controlled by the controller 200. Further, an opening 74 is formed at the sidewall of the chamber 1. A gate valve G for opening or closing the opening 74 is disposed at the opening 74.

A deposition shield 76 is detachably disposed along a surface of the inner sidewall of the chamber 1. Further, a deposition shield 77 is disposed on an outer peripheral surface of the inner wall member 3a to surround the inner wall member 3a. The deposition shields 76 and 77 prevent etching by-products (deposits) from being attached to the inner wall of the chamber 1. A conductive member (GND block) 79 is disposed at a portion of the deposition shield 76 at a height position substantially the same as the height of the wafer W attracted and held on the electrostatic chuck 6. Due to the presence of the GND block 79, abnormal discharge is suppressed.

A magnet 9 extending concentrically is disposed outside the chamber 1 to surround the chamber 10. The magnet 9 generates a magnetic field in a space between the shower head 16 and the base 2a. The magnet 9 is rotatably held by a rotation mechanism (not shown).

<Configuration of the Electrostatic Chuck>

Figure 2:
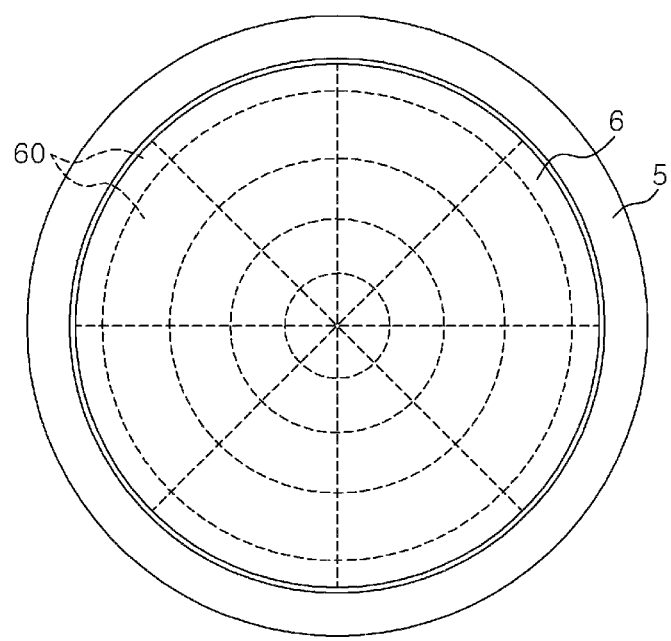
FIG. 2 shows an example of an upper surface of an electrostatic chuck.

FIG. 2 shows an example of the upper surface of the electrostatic chuck 6. The edge ring 5 is disposed on an outer peripheral portion of the electrostatic chuck 6 to surround the electrostatic chuck 6. The upper surface of the electrostatic chuck 6 on which the semiconductor wafer W is supported is divided into a plurality of divided regions 60. The electrostatic chuck 6 is divided into, e.g., a plurality of concentric regions. Each of the concentric regions except the central region is divided into a plurality of regions in a circumferential direction.

In the present embodiment, the upper surface of the electrostatic chuck 6 is concentrically divided into five regions as shown in FIG. 2, for example. Further, each of the concentric regions is divided into eight regions in the circumferential direction. Therefore, in the present embodiment, the upper surface of the electrostatic chuck 6 is divided into forty divided regions 60. The method of dividing the upper surface of the electrostatic chuck 6 is not limited to the example shown in FIG. 2.

One heater 6c is provided in each divided region 60 of the electrostatic chuck 6. One or more heaters 5b are disposed in the support 5a that supports the edge ring 5 along the shape of the edge ring 5. The powers supplied to forty heaters 6c disposed in the divided regions 60 of the electrostatic chuck 6 and the powers supplied to one or more heaters 5b disposed in the support 5a are individually controlled by the controller 200.

<Configuration of the Controller>

Figure 3:
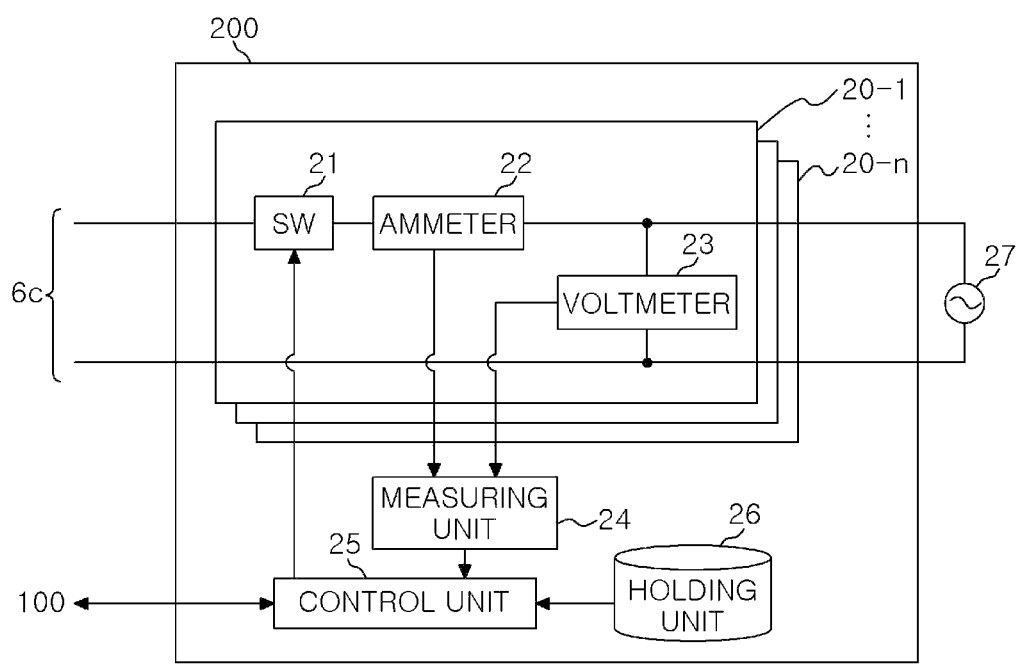
FIG. 3 is a block diagram showing an example of a configuration of a controller.

FIG. 3 is a block diagram showing an example of the controller 200. As shown in FIG. 3, for example, the controller 200 includes a plurality of power supply units 20-1 to 20-n, a measuring unit 24, a control unit 25, and a holding unit 26. In the following description, the power supply units 20-1 to 20-n are collectively referred to as "power supply unit 20" unless otherwise stated.

The power supply unit 20 is provided for each of the heaters 6c disposed in the divided regions 60 of the electrostatic chuck 6 to supply a power to a corresponding heater 6c. In the present embodiment, the substrate processing apparatus 100 has forty heaters 6c, and forty power supply units 20 are provided for each of the forty heaters 6c, respectively. Each of the power supply units 20 includes a switch SW 21, an ammeter 22, and a voltmeter 23. Although it is not shown in FIG. 3, one power supply unit 20 is provided for each of one or more heaters 5b disposed in the support 5a.

The SW 21 is turned on or off under the control of the control unit 25 and the power from a power source 27 is supplied to a corresponding heater 6c through the SW 21 during an ON period. The ammeter 22 measures an instantaneous value of an AC current supplied from the power source 27 to a corresponding heater 6c and outputs the measured value to the measuring unit 24. The voltmeter 23 measures an instantaneous value of an AC voltage supplied from the power source 27 to a corresponding heater 6c and outputs the measured value to the measuring unit 24.

The measuring unit 24 measures respective resistance values of the heaters 6c based on the measured voltages and the measured currents outputted from the power supply units 20 and supplied to the heaters 6c. Then, the measuring unit 24 outputs the resistance values of the heaters 6c to the control unit 25. Further, the measuring unit 24 measures voltages $V_S$ and frequencies of the power source that are supplied to the heaters 6c, and outputs the measured voltages $V_S$ and the measured frequencies to the control unit 25.

The holding unit 26 holds a conversion table 260 and a correction table 265. FIG. 4 shows an example of the conversion table 260. As shown in FIG. 4, for example, in the conversion table 260, individual tables 262 are respectively stored for region IDs 261 that identify the divided regions 60 where the heaters 6c are provided. In each individual table 262, the temperature is stored in association with the resistance value. The conversion table 260 is an example of temperature conversion data.

FIG. 5 shows an example of the correction table 265. As shown in FIG. 5, for example, in the correction table 265, individual tables 267 are stored for the respective frequencies 266 of the power source. In each individual table 267, individual tables 269 are stored for the respective region IDs 268 that identify the divided regions 60 where the heaters 6c are provided. In each individual table 269, a temperature correction value is stored in association with a magnitude of the source voltage $V_S$. In the present embodiment, the magnitude of the source voltage $V_S$ stored in the individual table 269 is the square of an effective value (RMS value) of the source voltage $V_S$. The correction table 265 is an example of correction data.

Further, the holding unit 26 holds a recipe that specifies the process of the semiconductor wafer W. The recipe includes data on target temperatures of the divided regions 60 for each step of the process. The conversion table 260, the correction table 265, the recipe, and the like are created in advance by an operator of the substrate processing system 10 and stored in the holding unit 26.

The control unit 25 controls the respective components of the substrate processing apparatus 100 based on the recipe held in the holding unit 26. Further, the control unit 25 controls the powers supplied to the heaters 6c in the divided regions 60 of the electrostatic chuck 6 in each step of the process so that the temperatures of the divided regions 60 become the target temperatures specified by the recipe.

Specifically, the control unit 25 reads the data on the target temperatures of the divided regions 60, the conversion table 260, and the correction table 265 from the holding unit 26 in each step of the process. Further, the control unit 25 frequently obtains the resistance values of the heaters 6c measured by the measuring unit 24. Then, the control unit 25 refers to the conversion table 260 for the respective divided regions 60 of the electrostatic chuck 6 and estimates the temperatures corresponding to the resistance values of the heaters 6c in the divided regions 60 as the temperatures of the heaters 6c. Then, the control unit 25 corrects the estimated temperatures of the heaters 6c while referring to the correction table 265 for the respective divided regions 60. The corrected temperatures of the heaters 6c can be considered as the temperatures of the divided regions 60 where the heaters 6c are provided. The control unit 25 controls the powers supplied to the heaters 6c by controlling an on/off ratio of the SW 21 in the power supply unit 20 based on the difference between the corrected temperatures and the target temperatures for the respective divided regions 60. Accordingly, the temperatures of the divided regions 60 can become close to the target temperatures.

Figure 6:
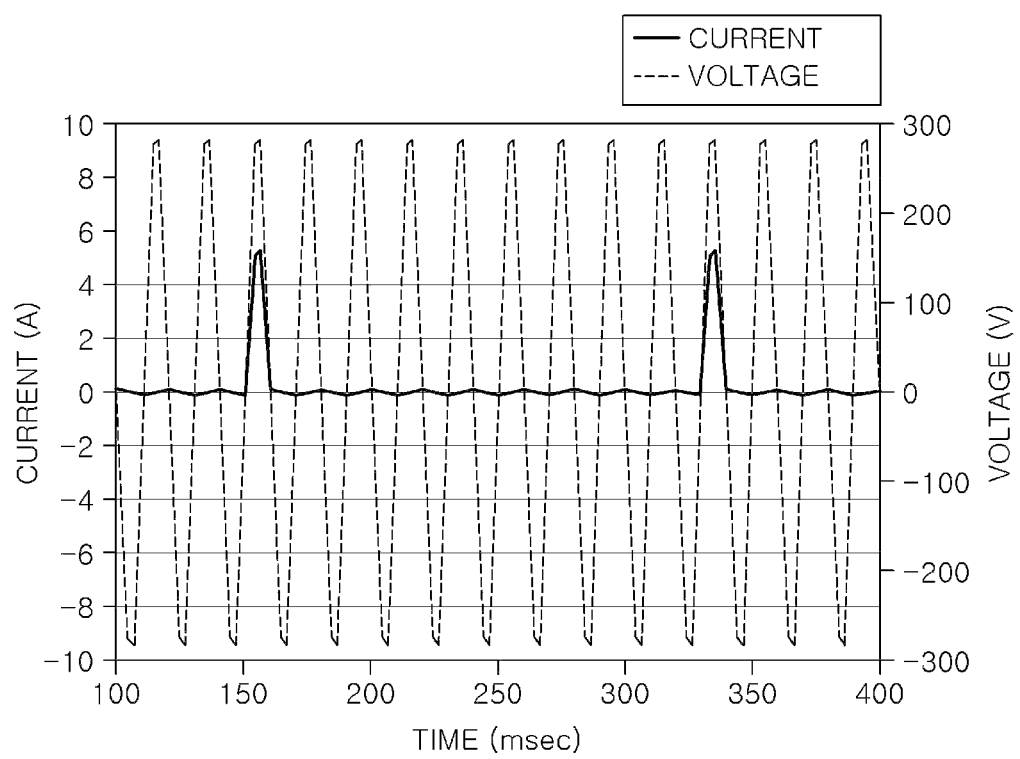
FIG. 6 shows an example of waveforms of an AC voltage and an AC current supplied to each heater.

As shown in FIG. 6, for example, an AC voltage of a predetermined frequency (e.g., 50 Hz or 60 Hz) is outputted from the power source 27, and a voltage and a current are supplied to each heater 6c when the SW 21 is turned on. FIG. 6 shows an example of waveforms of an AC voltage and an AC current supplied to each heater 6c. The measuring unit 24 measures instantaneous values of the voltage and the current supplied to each heater 6c at multiple timings during a period in which the current is supplied to the heaters 6c.

The measuring unit 24 calculates, for each heater 6c, effective values (RMS values) of the voltage and the current during the period in which the current is supplied based on the measured values of the voltage and the current. Then, the measuring unit 24 calculates the resistance value of each heater 6c from the calculated effective values of the voltage and the current. By measuring the relationship between the resistance value and the temperature in advance for each heater 6c, the temperatures of the heaters 6c can be estimated from the measured resistance values.

In a factory where semiconductors are manufactured, various devices for performing manufacturing, transferring, or the like are in operation. Therefore, the source voltage used in the factory may vary depending on the operating status of the devices. Accordingly, if the source voltage used in the factory is different from the source voltage used for measuring the relationship between the resistance values and the temperatures in advance, the relationship between the resistance values and the temperatures may be changed.

FIGS. 7A to 7C show an example of a temperature increase of each heater 6c due to the power supplied thereto. FIG. 7A shows an example of a voltage supplied to each heater 6c during an ON period of the SW 21. FIG. 7B shows an example of a current supplied to each heater 6c during the ON period of the SW 21. FIG. 7C shows an example of a temperature change of each heater 6c during the ON period of the SW 21. In the examples shown in FIGS. 7A to 7C, the ON period of the SW 21 has a length corresponding to a half cycle of the voltage.

For example, in the ON period $\Delta t_{ON}$ of the SW21, a voltage having a maximum value of $V_{mL}$ is supplied to each heater 6c as shown in FIG. 7A, and a current having a maximum value of $I_{mL}$ is supplied to each heater 6c as shown in FIG. 7B. Accordingly, as shown in FIG. 7C, for example, in the ON period of the SW21, the temperature of each heater 6c increases in response to the supplied power. When the temperature of the heater 6c increases, it is difficult for electrons to flow in the heater 6c and the resistance of the heater 6c increases.

Here, a certain delay $\Delta_{td}$ exists between the timing at which the power is supplied and the timing at which the temperature of the heater 6c changes due to the power supplied thereto. Therefore, a part of the increase in the resistance of the heater 6c is not reflected in the measured values (effective values) of the voltage and the current obtained during the ON period $\Delta t_{ON}$. In the example shown in FIG. 7C, although the temperature of each heater 6c increases up to $T_{L1}$ from the supplied power, the resistance of each heater 6c is calculated by using the voltage and the current measured until the temperature increases up to $T_{L2}$ during the ON period $\Delta t_{ON}$. Therefore, the measured resistance of each heater 6c is lower than the actual resistance by the resistance value corresponding to a temperature difference $\Delta T_L$.

If the effective value of the source voltage $V_S$ used for measuring the relationship between the resistance and the temperature in advance is the same as the effective value of the source voltage $V_S$ used for performing the actual process, $\Delta T_L$ is the same. Accordingly, the relationship between the resistance and the temperature measured in advance is substantially the same as the relationship between the resistance and the temperature measured in the actual process.

However, in the actual process, when a voltage having a maximum value of $V_{mH}$ that is greater than $V_{mL}$ is supplied to each heater 6c as shown in FIGS. 8A to 8C, for example, the relationship between the resistance and the temperature measured in advance is different from the relationship between the resistance and the temperature measured in the actual process. FIGS. 8A to 8C show an example of a temperature increase of each heater 6c due to the power supplied thereto. FIG. 8A shows an example of a voltage supplied to each heater 6c during an ON period of the SW 21. FIG. 8B shows an example of a current supplied to each heater 6c during the ON period of the SW 21. FIG. 8C shows an example of a temperature change of each heater 6c during the ON period of the SW 21. In the examples shown in FIGS. 8A to 8C, the voltage $V_S$ of the power source 27 is higher than that of the examples shown in FIGS. 7A to 7C.

In the example of FIG. 8C, although the temperature of each heater 6c increases up to $T_{H1}$ from the supplied power, the resistance of each heater 6c is calculated by using the voltage and the current measured until the temperature increases up to $T_{H2}$ during the ON period $\Delta t_{ON}$. Therefore, the measured resistance of each heater 6c is lower than the actual resistance by the resistance value corresponding to a temperature difference $\Delta T_H$ that is greater than the temperature difference $\Delta T_L$. Accordingly, in the case of measuring the relationship between the resistance and the temperature in advance at the voltage $V_S$ having the magnitude illustrated in FIGS. 7A to 7C and using the voltage $V_S$ having the magnitude illustrated in FIGS. 8A to 8C in the actual process, the estimated temperature of each heater 6c is lower than the actual temperature. Therefore, in the actual process, an excessive power is supplied to each heater 6c, and the temperature of each heater 6c becomes higher than the target temperature.

On the other hand, in the case of measuring the relationship between the resistance and the temperature in advance at the voltage $V_S$ having the magnitude illustrated in FIGS. 8A to 8C and using the voltage $V_S$ having the magnitude illustrated in FIGS. 7A to 7C in the actual process, the estimated temperature of each heater 6c is higher than the actual temperature. Therefore, in the actual process, the temperature of each heater 6c becomes lower than the target temperature.

Accordingly, in the present embodiment, the temperature of the heater 6c, which is estimated from the resistance of the heater 6c measured in the actual process, is corrected based on the magnitude (effective value) of the source voltage $V_S$. For example, when the voltage $V_S$ being supplied to each heater 6c is greater than the voltage $V_S$ supplied to each heater 6c at the time of measuring the relationship between the resistance and the temperature in advance, the temperature of the heater 6c estimated from the resistance is corrected to be higher as the voltage $V_S$ being supplied to each heater 6c becomes higher. On the other hand, when the voltage $V_S$ being supplied to each heater 6c is smaller than the voltage $V_S$ supplied to each heater 6c at the time of measuring the relationship between the resistance and the temperature in advance, the temperature of the heater 6c estimated from the resistance is corrected to be lower as the voltage $V_S$ being supplied to each heater 6c becomes smaller.

Figure 9A:
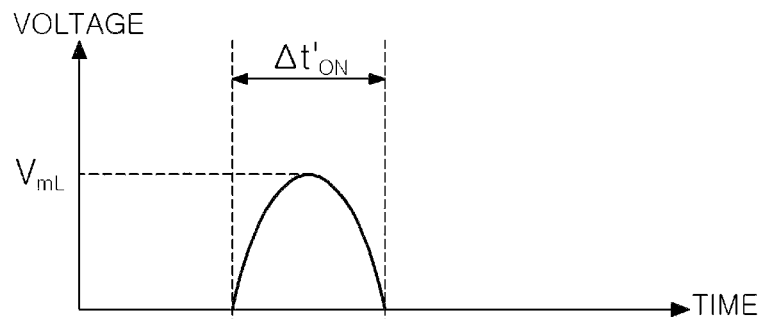
FIGS. 9A to 9C show an example of a heater temperature increase due to a power supplied to each heater.
Figure 9B:
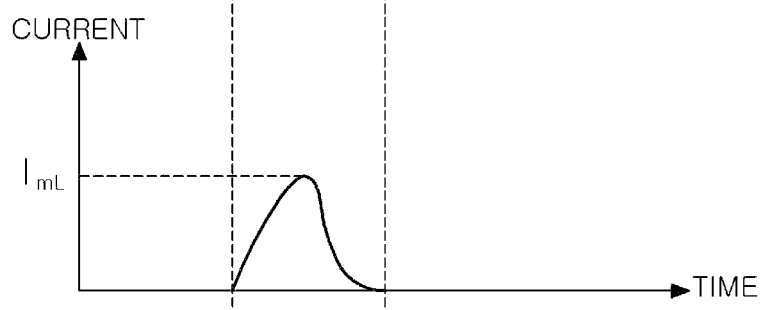
Figure 9C:
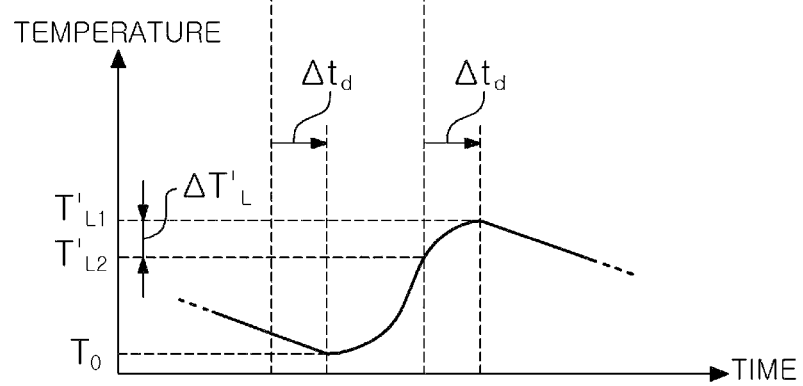

Further, the frequency of the power source 27 may vary depending on the area where the substrate processing system 10 is installed. When the frequency of the power source 27 used in the actual process is different from the frequency of the power source 27 used for measuring the relationship between the resistance and temperature in advance, the relationship between the resistance and the temperature measured in the actual process becomes different from the relationship measured in advance. FIGS. 9A to 9C show an example of a temperature increase of each heater 6c due to the power supplied thereto. FIG. 9A shows an example of a voltage supplied to each heater 6c during the ON period of the SW 21. FIG. 9B shows an example of a current supplied to each heater 6c during the ON period of the SW 21. FIG. 9C shows an example of a temperature change of each heater 6c during the ON period of the SW 21. In the examples shown in FIGS. 9A to 9C, the SW 21 is turned on during the period corresponding to a half cycle of the voltage. Further, in the examples shown in FIGS. 9A to 9C, the frequency of the voltage $V_S$ of the power source 27 is higher than that in the examples shown in FIGS. 7A to 7C, and a period $\Delta t'_{ON}$ in which the SW 21 is turned on is shorter than the period $\Delta t_{ON}$ shown in FIGS. 7A to 7C.

In the example of FIG. 9C, although the temperature of each heater 6c increases up to $T'_{L1}$ from the supplied power, the resistance of each heater 6c is calculated by using the voltage and the current measured until the temperature increases up to $T'_{L2}$ during the period $\Delta t'_{ON}$. Therefore, the measured resistance of each heater 6c is lower than the actual resistance by the resistance value corresponding to a temperature difference $\Delta T'_L$ greater than the temperature difference $\Delta T_L$. Accordingly, in the case of measuring the relationship between the resistance and the temperature in advance at the voltage $V_S$ having the frequency illustrated in FIGS. 7A to 7C and using the voltage $V_S$ having the frequency illustrated in FIGS. 9A to 9C in the actual process, the estimated temperature of each heater 6c is lower than the actual temperature. Therefore, in the actual process, an excessive power is supplied to each heater 6c, and the temperature of each heater 6c becomes higher than the target temperature.

On the other hand, in the case of measuring the relationship between the resistance and the temperature in advance at the voltage $V_S$ having the frequency illustrated in FIGS. 9A to 9C and using the voltage $V_S$ having the frequency illustrated in FIGS. 7A to 7C in the actual process, the estimated temperature of each heater 6c is higher than the actual temperature. Therefore, in the actual process, the temperature of each heater 6c becomes lower than the target temperature.

Accordingly, in the present embodiment, the temperature of the heater 6c, which is estimated from the resistance of the heater 6c measured in the actual process, is corrected based on the frequency of the source voltage $V_S$. For example, when the frequency of the voltage $V_S$ being supplied to each heater 6c is higher than the frequency of the voltage $V_S$ supplied to each heater 6c at the time of measuring the relationship between the resistance and the temperature in advance, the temperature of the heater 6c estimated from the resistance is corrected to be higher. On the other hand, the frequency of the voltage $V_S$ being supplied to each heater 6c is lower than the frequency of the voltage $V_S$ supplied to each heater 6c at the time of measuring the relationship between the resistance and the temperature in advance, the temperature of the heater 6c estimated from the resistance is corrected to be lower.

<Temperature Control Method>

Figure 10:
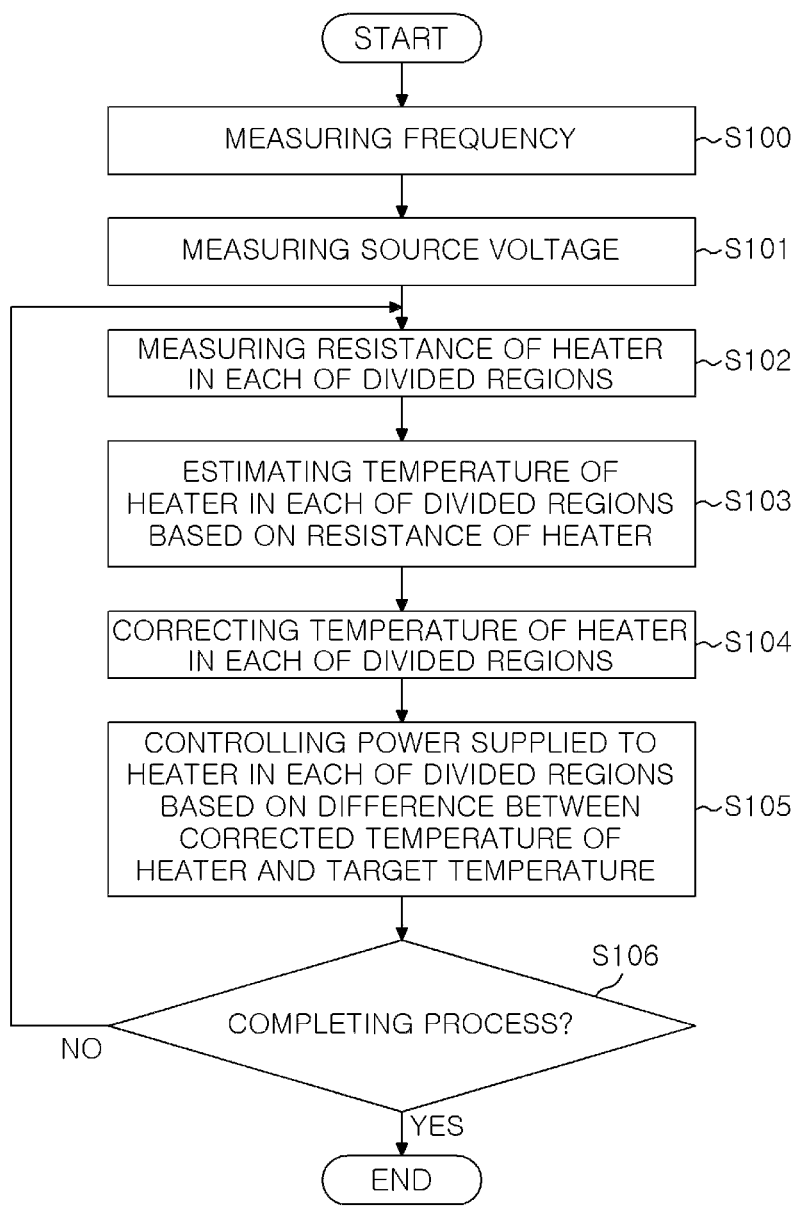
FIG. 10 is a flowchart showing an example of a temperature control method.

FIG. 10 is a flowchart showing an example of a temperature control method. The temperature control method shown in FIG. 10 is an example of a substrate processing method. For example, the controller 200 starts the temperature control method shown in the flowchart of FIG. 10 when the process based on the recipe is started. The data such as the conversion table 260, the correction table 265, the recipe, and the like are stored in the holding unit 26 in advance.

First, the measuring unit 24 measures the frequency of the power source 27 (S100). Then, the measuring unit 24 measures the effective value of the voltage $V_S$ of the power source 27 (S101). Step S101 is an example of a source voltage measuring step. Then, the measuring unit 24 outputs data on the measured frequency of the power source 27 and the data on the effective value of the voltage $V_S$ to the control unit 25.

Next, the control unit 25 controls the SWs 21 in the power supply units 20 to start the supply of powers to the heaters 6c in the divided regions 60, respectively. Then, the measuring unit 24 measures the resistances of the heaters 6c in the divided regions 60, respectively (S102). Step S102 is an example of a resistance measuring step. For example, the ammeter 22 and the voltmeter 23 measure, for each of the divided regions 60, the voltage $V_S$ and the current supplied to the corresponding heater 6c multiple times during the ON period of the SW 21 and output the measured voltage and current values to the measuring unit 24. The measuring unit 24 calculates, for each of the divided regions 60, the effective value of the voltage from the instantaneous values of the voltage $V_S$ and calculates the effective value of the current from the instantaneous values of the current. Then, the measuring unit 24 calculates, for each of the divided regions, the resistance of the corresponding heater 6c during the ON period of the SW 21 based on the calculated effective values of the voltage $V_S$ and the current.

Next, the control unit 25 refers to the conversion table 260 in the holding unit 26 and estimates the temperature of the heater 6c in each of the divided regions 60 based on the resistance of the heater 6c in the corresponding divided region 60 (S103). Step S103 is an example of an estimation step. For example, the control unit 25 refers to the conversion table 260 and obtains, for each of the divided regions 60, a temperature corresponding to the resistance value closest to the measured resistance and a temperature corresponding to the resistance value second closest to the measured resistance. Then, the control unit 25 specifies a temperature corresponding to the resistance measured in step S102 by, e.g., linear interpolation of the two obtained temperatures.

Next, the control unit 25 corrects, for each of the divided regions 60, the temperature of the heater 6c estimated in step S103 (S104). Step S104 is an example of a correction step. For example, the control unit 25 refers to the correction table 265 in the holding unit 26 and selects a frequency closest to the frequency measured in step S100 among the frequencies associated with the individual table 267. The process of selecting the frequency closest to the measured frequency is an example of a selection step. Then, the control unit 25 selects the individual table 267 associated with the selected frequency. Then, the control unit 25 refers to the selected individual table 267 and specifies a correction value corresponding to the square of the effective value of the voltage $V_S$ of the power source 27 measured in step S101.

Then, the control unit 25 obtains a correction value corresponding to the square of the effective value of the voltage $V_S$ closest to the square of the effective value of the measured voltage $V_S$ of the power source 27 and a correction value corresponding to the square of the effective value of the voltage $V_S$ second closest to the square of the effective value of the measured voltage $V_S$ of the power source 27. Then, the control unit 25 specifies a correction value corresponding to the square of the effective value of the voltage $V_S$ of the power source 27 measured in step S101 by, e.g., linear interpolation of the obtained two correction values.

Then, the control unit 25 corrects, for each of the divided regions 60, the temperature of the heater 6c estimated in step S103 to the specified correction value. In the present embodiment, the control unit 25 corrects the temperature of each of the heaters 6c by adding the correction value to the temperature of the corresponding heater 6c.

Next, the control unit 25 controls, for each of the divided regions 60, the power supplied to the heater 6c by controlling an on/off ratio of the SW 21 in the power supply unit 20 based on the difference between the corrected temperature of the heater 6c and the target temperature (S105). Step S105 is an example of a control step.

Next, the control unit 25 refers to the recipe and determines whether or not the process is completed (S106). When the process is not completed (NO in S106), the measuring unit 24 executes step S102 again. On the other hand, when the process is completed (YES in S106), the controller 200 terminates the temperature control method shown in the flowchart of FIG. 10.

<Creation of the Conversion Table and the Correction Table>

Figure 11:
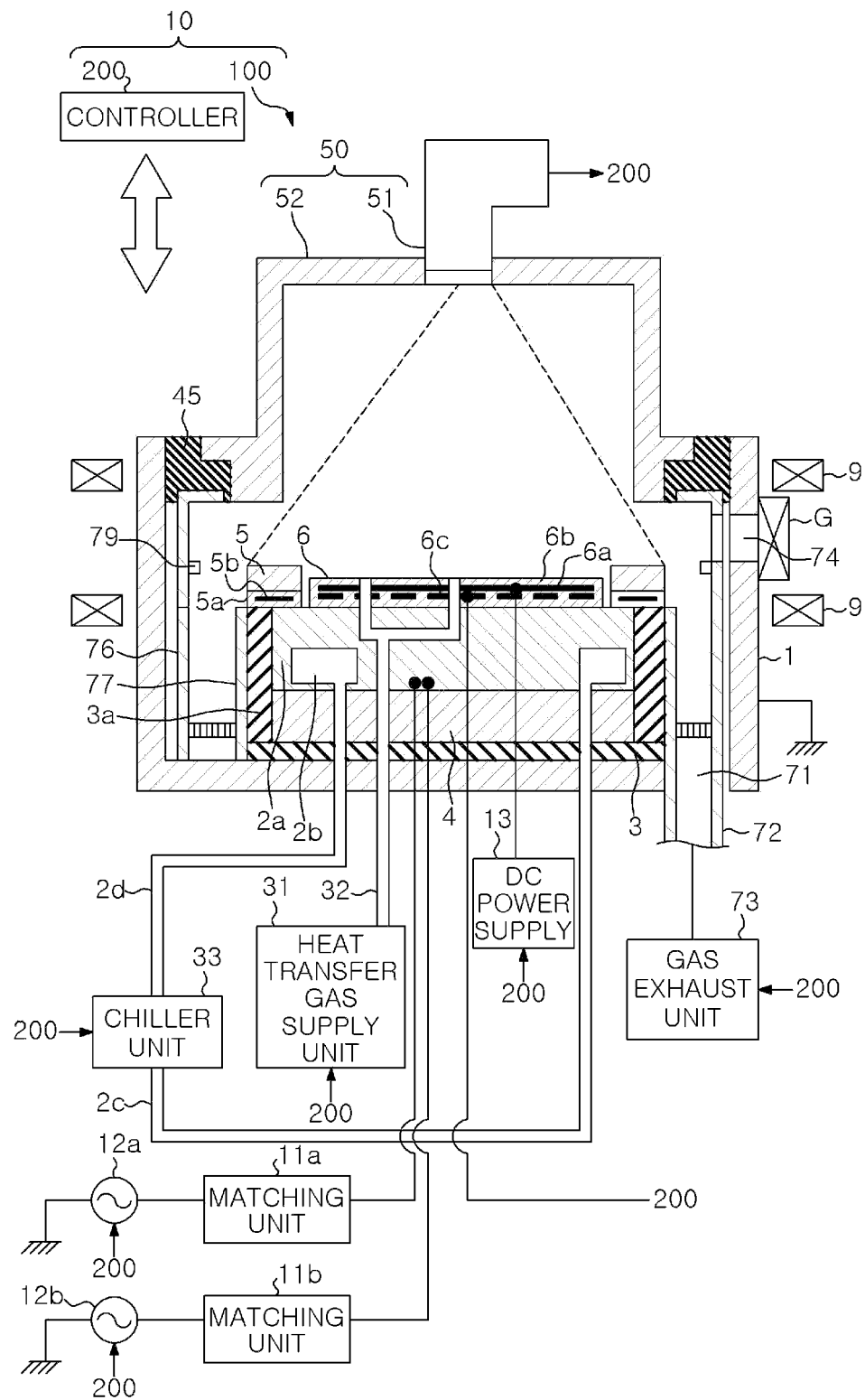
FIG. 11 shows an example of a configuration of the substrate processing system in the case of creating the conversion table and the correction table.

FIG. 11 shows an example of a configuration of the substrate processing system 10 in the case of creating the conversion table 260 and the correction table 265. In the case of creating the conversion table 260 and the correction table 265, the shower head 16 is removed from the chamber 1 and a calibration unit 50 is attached to the chamber 1 as shown in FIG. 11, for example. In FIG. 11, like reference numerals used in FIG. 1 are given to like parts and redundant description thereof will be omitted except for the following differences.

The calibration unit 50 includes an infrared (IR) camera 51 and a cover member 52. The cover member 52 supports the IR camera 51 such that an imaging direction of the IR camera 51 is directed to the electrostatic chuck 6. The IR camera 51 is controlled by the controller 200 and measures a temperature of the upper surface of the electrostatic chuck 6 based on infrared rays emitted from the upper surface of the electrostatic chuck 6. Then, the IR camera 51 outputs data indicating the distribution of the measured temperatures of the upper surface of the electrostatic chuck 6 to the controller 200. The controller 200 calculates the temperature of each of the divided regions 60 based on the data indicating the temperature distribution on the upper surface of the electrostatic chuck 6 outputted from the IR camera 51.

Figure 12:
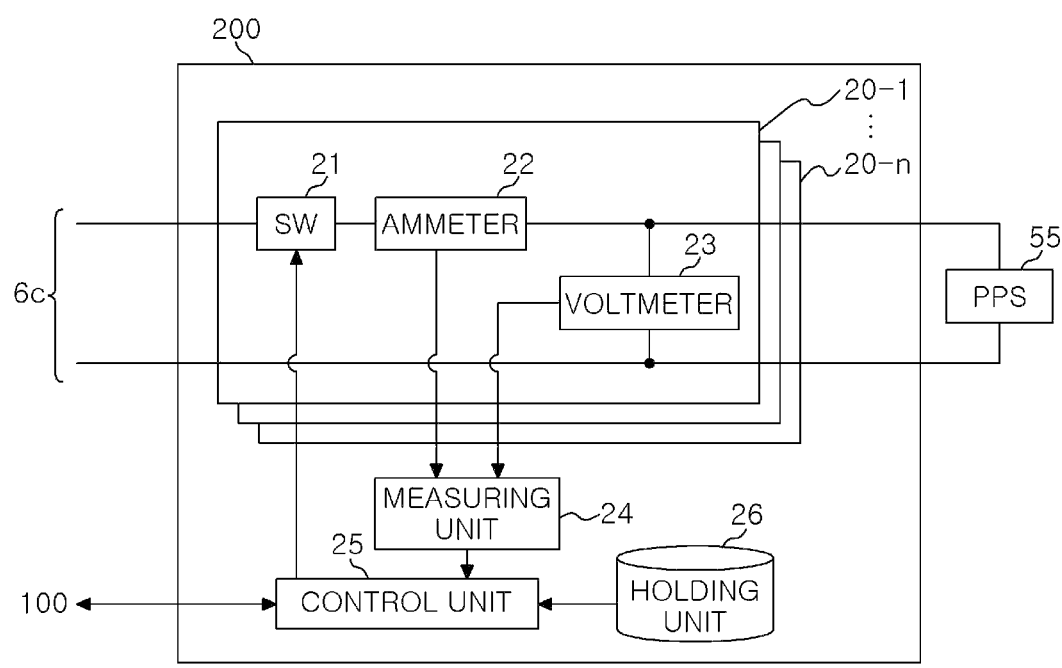
FIG. 12 is a block diagram showing an example of a configuration of the controller in the case of creating the conversion table and the correction table.

The configuration of the controller 200 in the case of creating the conversion table 260 and the correction table 265 is as shown in FIG. 12, for example. FIG. 12 is a block diagram showing an example of the configuration of the controller 200 in the case of creating the conversion table 260 and the correction table 265. In FIG. 12, like reference numerals used in FIG. 3 will be given to like parts and redundant description thereof will be omitted except for the following differences. In the case of creating the conversion table 260 and the correction table 265, power from a programmable power supply (PPS) 55 is supplied to the controller 200. The PPS 55 can change the frequency and the magnitude of the voltage $V_S$ supplied to the heater 6c in each of the divided regions 60 under the control of the controller 200.

<Sequence of Creating the Conversion Table>

Figure 13:
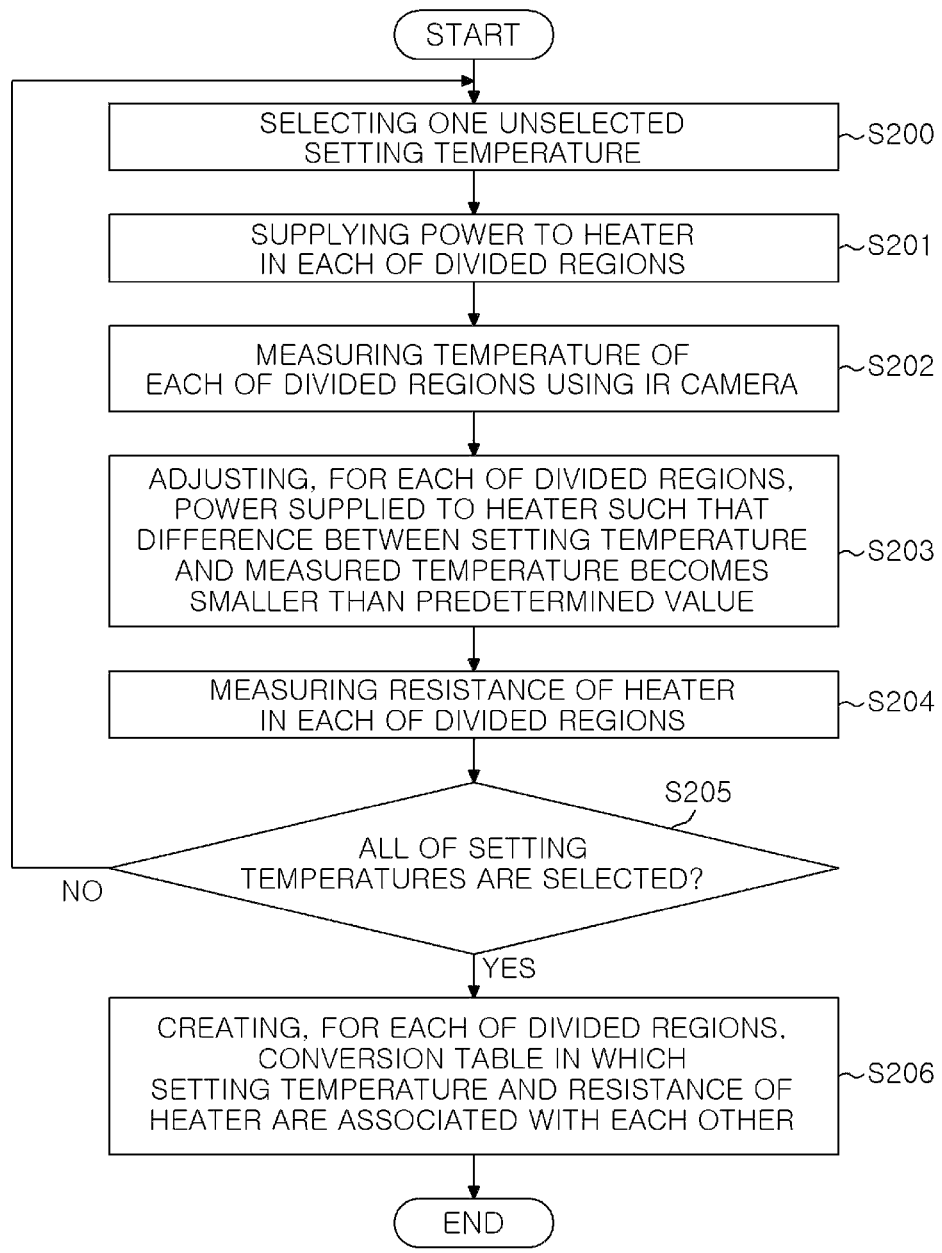
FIG. 13 is a flowchart showing an example of a sequence of creating the conversion table.

FIG. 13 is a flowchart showing an example of the sequence of creating the conversion table 260. The controller 200 starts the sequence of creating the conversion table 260 shown in the flowchart of FIG. 13 when an instruction for creating the conversion table 260 is received from the operator of the substrate processing system 10 or the like. Further, the data on each of setting temperatures to be set in the conversion table 260 is stored in the holding unit 26 in advance by the operator of the substrate processing system 10. The PPS 55 is set to output a predetermined voltage $V_S$ (e.g., 200 V).

First, the control unit 25 refers to the holding unit 26 and selects one unselected setting temperature among a plurality of preset temperatures (S200). In the present embodiment, eleven preset temperatures from 20° C. to 120° C. at an interval of 10° C. are stored in advance in the holding unit 26.

Next, the control unit 25 supplies the power to the heater 6c in each of the divided regions 60 (S201). Then, the control unit 25 measures the temperature of each of the divided regions 60 using the IR camera 51 (S202).

Next, the control unit 25 adjusts, for each of the divided regions 60, the power supplied to the heater 6c such that the difference between the setting temperature selected in step S200 and the temperature measured by the IR camera 51 becomes smaller than a predetermined value (e.g., 0.1° C.) (S203).

When the difference between the setting temperature and the measured temperature is smaller than the predetermined value in each of the divided regions 60, the measuring unit 24 measures the resistance of the heater 6c in each of the divided regions 60 (S204). Then, the control unit 25 holds, for each of the divided regions 60, the setting temperature and the resistance of the heater 6*c* in association with each other.

Next, the control unit 25 determines whether or not all of the setting temperatures are selected (S205). If there is an unselected setting temperature (NO in S205), the control unit 25 executes step S200 again. On the other hand, if all of the setting temperatures are selected (YES in S205), the control unit 25 creates, for each of the divided regions 60, the conversion table 260 in which the setting temperature and the resistance of the heater 6*c* are associated with each other (S206). Then, the control unit 25 stores the created conversion table 260 in the holding unit 26 and completes the sequence of creating the conversion table 260 shown in the flowchart of FIG. 13.

<Sequence of Creating the Correction Table>

Figure 14:
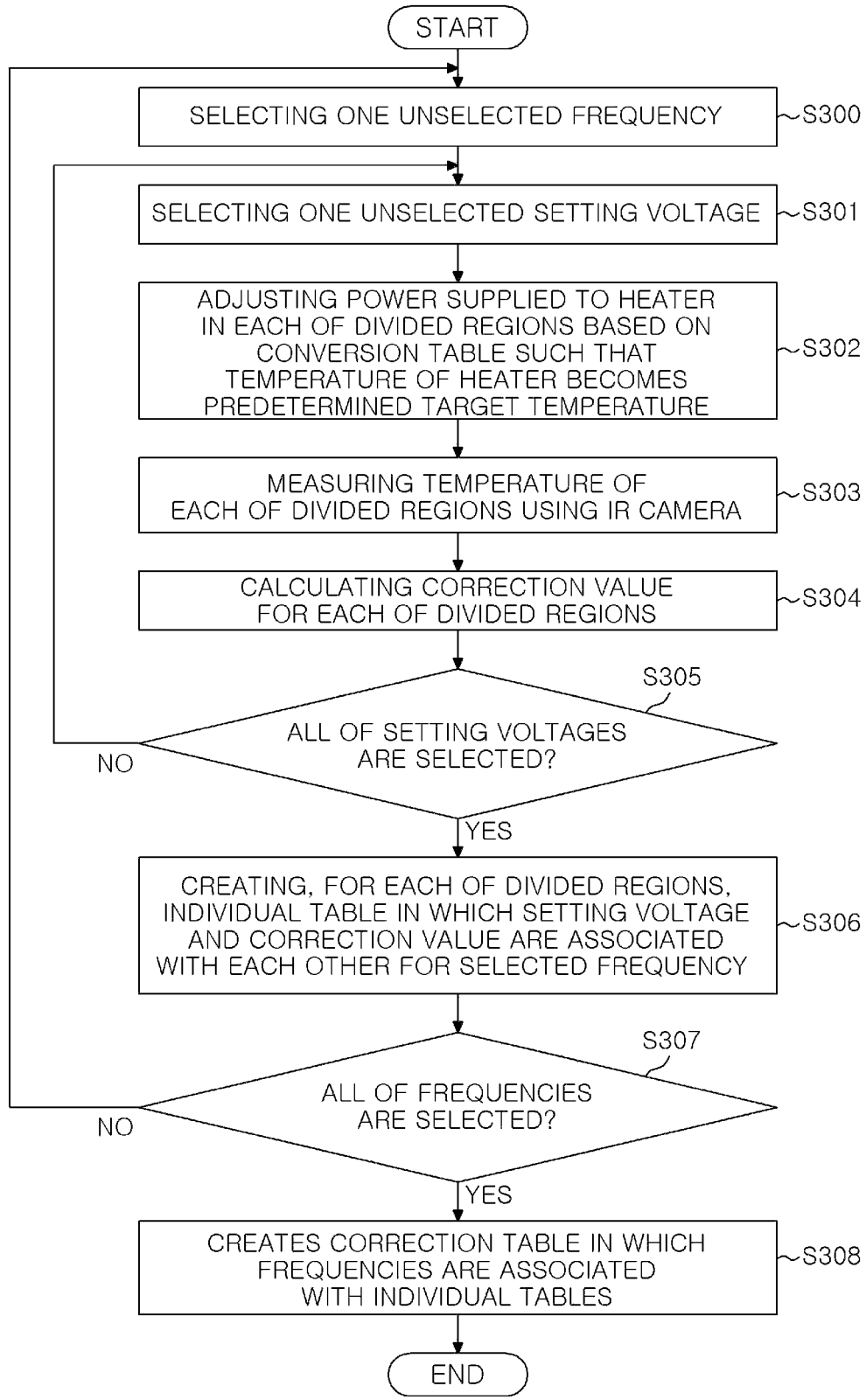
FIG. 14 is a flowchart showing an example of a sequence of creating the correction table.

FIG. 14 is a flowchart showing an example of a sequence of creating the correction table 265. The sequence of creating the correction table 265 is an example of a correction data creating method. The controller 200 starts the sequence of creating the correction table 265 shown in the flowchart of FIG. 14 after the creation of the conversion table 260. Further, the data on each of the setting voltages $V_S$ and the data on each of the frequencies to be set in the conversion table 260 are stored in the holding unit 26 in advance by the operator of the substrate processing system 10.

First, the control unit 25 refers to the holding unit 26 and selects one unselected frequency among a plurality of predetermined frequencies (S300). In the present embodiment, two types of frequencies, e.g., 50 Hz and 60 Hz, are stored in advance in the holding unit 26. Then, the control unit 25 controls the PPS 55 to output the voltage of the selected frequency. Step S300 is an example of a selection step.

Next, the control unit 25 refers to the holding unit 26 and selects one unselected setting voltage $V_S$ among a plurality of predetermined setting voltages $V_S$ (S301). In the present embodiment, six types of setting voltages from 180 V to 230 V at an interval of 10 V are stored in advance in the holding unit 26. Then, the control unit 25 controls the PPS 55 to output the selected setting voltage $V_S$. Accordingly, the power of the selected setting voltage $V_S$ is supplied to each heater 6*c*. In consideration of accuracy, it is preferable to measure the correction value for five or more setting voltages $V_S$. Step S301 is an example of a supply step.

Next, the control unit 25 adjusts the power supplied to the heater 6*c* in each of the divided regions 60 such that the temperature of the heater 6*c* becomes a predetermined target temperature (e.g., +80° C.) (S302). In step S302, the measuring unit 24 measures the resistance of the heater 6*c* in each of the divided regions 60 from the effective values of the voltage $V_S$ and the current supplied to the heater 6*c*, and the control unit 25 refers to the conversion table 260 to estimate the temperature of the heater 6*c* in each of the divided regions 60 from the measured resistance. Then, the control unit 25 controls the power supplied to the heater 6*c* based on the difference between the estimated temperature and the target temperature. In other words, at the source voltage selected in step S301, the power supplied to the heater 6*c* in each of the divided regions 60 is adjusted such that the resistance of the heater 6*c* becomes the resistance value corresponding to the predetermined target temperature based on the conversion table 260. The target temperature is an example of a first temperature. Step S302 is an example of an adjustment step.

Next, the control unit 25 measures the temperature of each of the divided regions 60 using the IR camera 51 (S303). The temperature of each of the divided regions 60 measured by the IR camera 51 is an example of a second temperature. Step S303 is an example of a temperature measuring step. Then, the control unit 25 calculates, for each of the divided regions 60, a correction value based on the difference between the measured temperature of the corresponding divided region 60 and the target temperature (S304). In the present embodiment, the control unit 25 calculates, for each of the divided regions 60, the correction value by subtracting the measured temperature of the corresponding divided region 60 from the target temperature. Step S304 is an example of a correction value calculation step. Then, the control unit 25 holds, for each of the divided regions 60, the calculated correction value in association with the frequency selected in step S300 and the square of the effective value of the setting voltage $V_S$ selected in step S301.

Next, the control unit 25 determines whether or not all of the setting voltages $V_S$ are selected (S305). If there is an unselected setting voltage $V_S$ (NO in S305), the control unit 25 executes step S301 again. On the other hand, if all of the setting voltages $V_S$ are selected (YES in S305), the control unit 25 creates, for each of the divided regions 60, the individual table 267 in which the square of the effective value of the setting voltage $V_S$ and the correction value are associated with each other for the frequency selected in step S300 (S306). Step S306 is an example of a creation step.

Next, the control unit 25 determines whether or not all of the frequencies are selected (S307). If there is an unselected frequency (NO in S307), the control unit 25 executes step S300 again. On the other hand, if all of the frequencies are selected (YES in S307), the control unit 25 creates the correction table 265 in which the frequencies are associated with the individual tables 267 (S308). Then, the control unit 25 stores the created correction table 265 in the holding unit 26 and completes the sequence of creating the correction table 265 shown in the flowchart of FIG. 14.

<Hardware>

Figure 15:
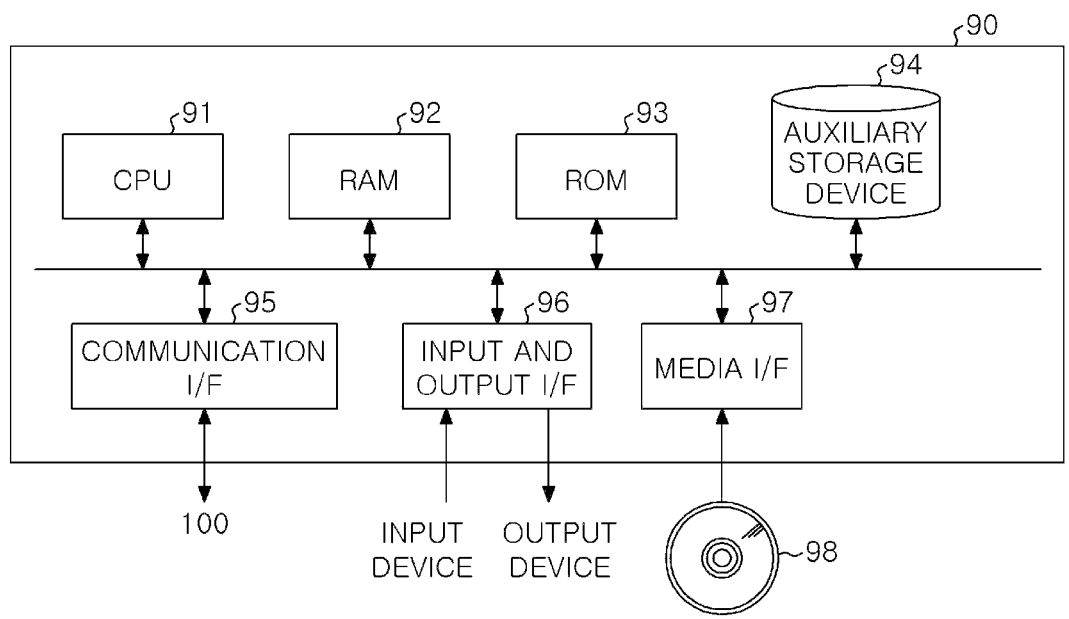
FIG. 15 shows an example of a computer that realizes functions of the controller.

The controller 200 is realized by, e.g., a computer 90 having a configuration shown in FIG. 15. FIG. 15 shows an example of the computer 90 that realizes the functions of the controller 200. The computer 90 includes a central processing unit (CPU) 91, a random access memory (RAM) 92, a read only memory (ROM) 93, an auxiliary storage device 94, a communication interface (I/F) 95, an input and output I/F 96, and a media I/F 97.

The CPU 91 operates based on a program stored in the ROM 93 or the auxiliary storage device 94 and controls the respective components. The ROM 93 stores a boot program executed by the CPU 91 at the time of start-up of the computer 90, a program that depends on the hardware of the computer 90 or the like.

The auxiliary storage device 94 is, e.g., a hard disk drive (HDD) or a solid state drive (SSD) and stores a program executed by the CPU 91 and data used by the program. The CPU 91 reads the program from the auxiliary storage device 94, loads the program on the RAM 92, and executes the loaded program.

The communication I/F 95 communicates with the substrate processing apparatus 100 through a communication line such as a local area network (LAN) or the like. The communication I/F 95 receives data from the substrate processing apparatus 100 through the communication line and transmits the data to the CPU 91. Further, the communication I/F 95 transmits data generated by the CPU 91 to the substrate processing apparatus 100 through the communication line.

The CPU 91 controls an input device such as a keyboard or the like and an output device such as a display or the like through the input and output I/F 96. The CPU 91 obtains a signal inputted from the input device and transmits the signal to the CPU 91 through the input and output I/F 96. Further, the CPU 91 outputs the generated data to the output device through the input and output I/F 96.

The media I/F 97 reads the program or the data stored in the storage medium 98 and stores the program or the data in the auxiliary storage device 94. The storage medium 98 is, e.g., an optical storage medium such as a digital versatile disk (DVD), a phase change rewritable disk (PD) or the like, a magneto-optical storage medium such as a magneto-optical disk (MO) or the like, a tape medium, a magnetic storage medium, or a semiconductor memory.

The CPU 91 of the computer 90 realizes the functions of the power supply unit 20, the measuring unit 24, and the control unit 25 by executing the program loaded on the RAM 92. Further, the data in the holding unit 26 is stored in the auxiliary storage device 94.

The CPU 91 of the computer 90 reads the program loaded on the RAM 92 from the storage medium 98 and stores the program in the auxiliary storage device 94. In another example, the program may be obtained from another device through a communication line and stored in the auxiliary storage device 94.

As described above, the correction data creating method of the present embodiment includes the supply step, the adjustment step, the temperature measuring step, the correction value calculation step, and the creation step. In the supply step, a source voltage is sequentially selected from a plurality of source voltages determined in advance, and the selected source voltage is supplied to the heater 6c for heating the electrostatic chuck 6 on which the semiconductor wafer W is supported. In the adjustment step, at the source voltage supplied to the heater 6c, the power supplied to the heater 6c is adjusted such that the resistance of the heater 6c becomes a resistance value corresponding to the predetermined first temperature based on the temperature conversion data indicating the relationship between the resistance of the heater 6c and the temperature of the heater 6c. In the temperature measuring step, the temperature of the electrostatic chuck 6 at the position where the heater 6c is provided is measured as the second temperature. In the correction value calculation step, the correction value corresponding to the difference between the predetermined first temperature and the second temperature is calculated. In the creation step, the correction data indicating a corresponding relationship between each of the source voltages and the correction value is created. The temperature of the semiconductor wafer W can be controlled with a very high degree of accuracy using the created correction data.

Further, in the above-described embodiment, the correction data is the correction table 265 in which the square of the effective value of each of the source voltages and the correction value therefor are stored in association with each other. Accordingly, the correction data can be created quickly.

Further, in the above-described embodiment, the electrostatic chuck 6 is divided into the plurality of divided regions 60, and the heater 6c is provided in each of the divided regions 60. The supply step, the adjustment step, the temperature measurement step, the correction value calculation step, and the creation step are executed for the heater 6c in each of the divided regions 60. Accordingly, the temperature of the semiconductor wafer W can be controlled more accurately.

The correction data creating method of the above-described embodiment further includes a selection step of sequentially selecting a frequency of the source voltage among a plurality of predetermined frequencies. The supply step, the adjustment step, the temperature measurement step, the correction value calculation step, and the creation step are executed for each of the source voltages having the frequency selected in the selection step. Further, the correction data is created for each of the source voltages having the frequency selected in the selection step. Accordingly, the temperature of the semiconductor wafer W can be controlled with high accuracy regardless of different frequencies of the power source 27.

The substrate processing method of the above-described embodiment includes the source voltage measuring step, the resistance measuring step, the estimation step, the correction step, and the control step. In the source voltage measuring step, the source voltage supplied to the heater 6c is measured. In the resistance measuring step, the resistance of the heater 6c is measured. In the estimation step, the temperature of the heater 6c is estimated from the measured resistance of the heater 6c based on the temperature conversion data. In the correction step, the correction value corresponding to the measured source voltage is specified from the correction data created by the above-described correction data creating method, and the estimated temperature of the heater 6c is corrected using the specified correction value. In the control step, the power supplied to the heater 6c is controlled such that the temperature of the heater 6c becomes a predetermined temperature based on the corrected temperature of the heater 6c. Accordingly, the temperature of the semiconductor wafer W can be controlled with a very high degree of accuracy.

Further, in the correction step of the above-described embodiment, the correction value corresponding to the source voltage measured in the source voltage measurement step is specified by interpolating the source voltage and the correction value stored in the correction table 265, and the estimated temperature of the heater is corrected using the specified correction value. Accordingly, the correction value can be specified quickly.

Further, in the above-described embodiment, the electrostatic chuck 6 is divided into a plurality of divided regions 60, and the heater 6c is provided in each of the divided regions 60. The source voltage measuring step, the resistance measuring step, the estimation step, the correction step, and the control step are executed for the heater 6c in each of the divided regions 60. Accordingly, the temperature of the semiconductor wafer W can be controlled more accurately.

Further, in the above-described embodiment, the correction data is prepared for each of the plurality of predetermined frequencies, and the temperature control method further includes a selection step of selecting the frequency of the source voltage. In the correction step, the estimated temperature of the heater 6c is corrected using the correction data corresponding to the frequency selected in the selection step. Accordingly, the temperature of the semiconductor wafer W can be controlled with high accuracy regardless of different frequencies of the power source 27.

The substrate processing system 10 of the above-described embodiment includes the electrostatic chuck 6, the heaters 6c, the power supply units 20, the measuring unit 24, the holding unit 26, and the control unit 25. The semiconductor wafer W is supported on the electrostatic chuck 6. The heaters 6c are disposed in the electrostatic chuck 6 and heat the semiconductor wafer W with powers supplied thereto. The power supply units 20 supply the powers to the heaters 6c, respectively. The measuring unit 24 measures the resistances of the heaters 6c. The holding unit 26 holds the temperature conversion data indicating the relationship between the resistances of the heaters 6c and the temperatures of the heaters 6c, and the correction data indicating the corresponding relationship between the source voltages supplied to the heaters 16c and the correction values of the temperatures of the heaters 6c. The control unit executes the source voltage measuring step, the resistance measuring step, the estimation step, the correction step, and the control step. In the source voltage measuring step, the source voltages respectively supplied to the heaters 6c are measured. In the resistance value measuring step, the respective resistances of the heaters 6c are measured. In the estimation step, the respective temperatures of the heaters 6c are estimated based on the temperature conversion data. In the correction step, correction values respectively corresponding to the measured source voltages are specified from the correction data and the estimated temperatures of the heaters 6c are respectively corrected using the specified correction values. In the control step, the powers supplied to the heaters 6c are controlled based on the corrected temperatures of the heaters 6c such that the temperatures of the heaters 6c become the predetermined temperature. Accordingly, the temperature of the semiconductor wafer W can be controlled with a very high degree of accuracy.

<Other Applications>

The present disclosure is not limited to the above-described embodiments, and various modifications can be made within the scope of the gist of the present disclosure.

For example, in the above-described embodiment, the correction value corresponding to the square of the effective value of the voltage $V_S$ of the power source 27 is measured in advance for a plurality of voltages $V_S$ and stored in the correction table 265. Then, in the actual process, the correction value corresponding to the square of the effective value of the voltage $V_S$ supplied to each heater 6c in the actual process is specified by linear interpolation of the correction values stored in the correction table 265. However, the present disclosure is not limited thereto.

For example, the correction value corresponding to the square of the effective value of the voltage $V_S$ of the power source 27 may be measured in advance for a plurality of voltages $V_S$, and an approximation that approximates a change in the correction value corresponding to the square of the effective value of the voltage $V_S$ may be calculated. The approximation is a straight line or a curve that approximates the change in the correction value corresponding to the square of the effective value of the voltage $V_S$. In the actual process, the correction value corresponding to the square of the effective value of the voltage $V_S$ supplied to each heater 6c in the actual process is specified using the calculated approximation. Accordingly, the amount of data in the holding unit 26 can be reduced.

In the above-described embodiment, the measuring unit 24 measures the frequency of the power source 27. However, the present disclosure is not limited thereto. For example, a user interface for specifying the frequency of the power source 27 may be provided in the substrate processing apparatus 100 or the controller 200, and the control unit 25 may select the specified frequency through the user interface. The user interface may be, e.g., a switch or the like.

The presently disclosed embodiments are considered in all respects to be illustrative and not restrictive. The above-described embodiments can be embodied in various forms. Further, the above-described embodiments may be omitted, replaced, or changed in various forms without departing from the scope of the appended claims and the gist thereof.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A method for creating correction data comprising:
   selecting a setting voltage among a plurality of setting voltages determined in advance,
   supplying the selected setting voltage to a heater for heating a substrate support on which a substrate is supported;
   adjusting, at the setting voltage supplied to the heater, a power supplied to the heater such that a resistance of the heater becomes a resistance value corresponding to a predetermined first temperature based on temperature conversion data indicating a relationship between the resistance of the heater and a temperature of the heater;
   measuring a temperature of the substrate support, at a position where the heater is disposed, as a second temperature;
   calculating a correction value corresponding to a difference between the predetermined first temperature and the second temperature; and
   creating correction data indicating a corresponding relationship between each of the setting voltages and the correction value,
   wherein said selecting, said supplying, said adjusting, said measuring of the temperature, said calculating of the correction value, and said creating are executed for each of the setting voltages, and
   the correction data is created for each of the setting voltages.

2. The method of claim 1, wherein the correction data is a correction table in which a square of an effective value of each of the setting voltages and the correction value for each of the setting voltages are stored in association with each other.

3. The method of claim 1, wherein the correction data is an approximation that approximates a change in the correction value corresponding to the square of the effective value of each of the setting voltages.

4. The method of claim 1, wherein the substrate support is divided into a plurality of regions,
   the heater is provided in each of the regions, and
   said selecting, said supplying, said adjusting, said measuring of the temperature, said calculating of the correction value, and said creating are executed for the heater disposed in each of the regions.

5. The method of claim 1, further comprising:
   sequentially selecting a frequency of the setting voltage among a plurality of predetermined frequencies,
   wherein said selecting of the selected setting voltage, said supplying, said adjusting, said measuring of the temperature, said calculating of the correction value, and said creating are executed for each of the setting voltages having the frequency selected in said selecting of the frequency, and
   the correction data is created for each of the setting voltages having the frequency selected in said selecting of the frequency.

6. A substrate processing method comprising:

measuring a source voltage supplied to a heater for heating a substrate support;

measuring a resistance of the heater;

estimating a temperature of the heater from the measured resistance of the heater based on the temperature conversion data;

specifying the correction value corresponding to the measured source voltage from the correction data created by the method described in claim 1 and correcting the estimated temperature of the heater using the specified correction value; and controlling a power supplied to the heater such that the temperature of the heater becomes a predetermined temperature based on the corrected temperature of the heater.

7. The substrate processing method of claim 6, wherein the correction data is a correction table in which a square of an effective value of each of the source voltages and the correction value for each of the source voltages are stored in association with each other, and, in said correcting, the correction value corresponding to the source voltage measured in said measuring of the source voltage is specified by interpolating the source voltage and the correction value stored in the correction table, and the estimated temperature of the heater is corrected using the specified correction value.

8. The substrate processing method of claim 6, wherein the correction data is an approximation indicating a tendency of the correction value corresponding to the square of the effective value of each of the source voltages, and, in said correcting, the correction value corresponding to the source voltage measured in said measuring of the source voltage is specified using the approximation and the estimated temperature of the heater is corrected using the specified correction value.

9. The substrate processing method of claim 6, wherein the substrate support is divided into a plurality of regions, the heater is disposed in each of the regions, and said measuring of the source voltage, said measuring of the resistance, said estimating, said correcting, and said controlling are executed for the heater disposed in each of the regions.

10. The substrate processing method of claim 6, wherein the correction data is prepared for each of a plurality of predetermined frequencies, and the substrate processing method further comprises:
selecting a frequency of the source voltage,
wherein, in said correcting, the estimated temperature of the heater is corrected using the correction data corresponding to the frequency selected in said selecting.

11. A substrate processing system comprising:

a substrate support on which a substrate is supported;

a heater disposed in the substrate support to heat the substrate with a power supplied thereto;

a power supply unit configured to supply the power to the heater;

a measuring unit configured to measure a resistance of the heater;

a holding unit configured to hold temperature conversion data indicating a relationship between the resistance of the heater and a temperature of the heater and the correction data created by the method described in claim 1; and a control unit, wherein the control unit executes measuring the setting voltage supplied to the heater;

measuring the resistance of the heater;

estimating the temperature of the heater based on the temperature conversion data, specifying the correction value corresponding to the measured setting voltage from the correction data and correcting the estimated temperature of the heater using the specified correction value; and controlling the power supplied to the heater based on the corrected temperature of the heater such that the temperature of the heater becomes a predetermined temperature.

* * * * *